United States Patent
Zhang et al.

(10) Patent No.: US 10,288,953 B2
(45) Date of Patent: May 14, 2019

(54) PIXEL STRUCTURE AND LIQUID CRYSTAL DISPLAY PANEL

(71) Applicant: Shenzhen China Star Optoelectronics Technology Co., Ltd., Shenzhen (CN)

(72) Inventors: Mengmeng Zhang, Shenzhen (CN); Shouzhen Yue, Shenzhen (CN)

(73) Assignee: Shenzhen China Star Optoelectronics Technology Co., Ltd., Shenzhen (CN)

( * ) Notice: Subject to any disclaimer, the term of this patent is extended or adjusted under 35 U.S.C. 154(b) by 0 days.

(21) Appl. No.: 15/325,446

(22) PCT Filed: Dec. 14, 2016

(86) PCT No.: PCT/CN2016/109864
§ 371 (c)(1),
(2) Date: Jan. 11, 2017

(87) PCT Pub. No.: WO2018/072287
PCT Pub. Date: Apr. 26, 2018

(65) Prior Publication Data
US 2018/0107035 A1    Apr. 19, 2018

(30) Foreign Application Priority Data
Oct. 18, 2016    (CN) .......................... 2016 1 0908770

(51) Int. Cl.
*G02F 1/1343*    (2006.01)
*G09G 3/36*    (2006.01)
(Continued)

(52) U.S. Cl.
CPC ...... *G02F 1/1343* (2013.01); *G02F 1/134309* (2013.01); *G02F 1/136213* (2013.01); *G09G 3/36* (2013.01); *H01L 27/124* (2013.01); *H01L 27/3248* (2013.01); *H01L 33/387* (2013.01); *G02F 2001/134345* (2013.01)

(58) Field of Classification Search
USPC .......................................................... 345/92
See application file for complete search history.

(56) References Cited

U.S. PATENT DOCUMENTS 6,423,385 B1 * 7/2002 Kagawa ............ G02F 1/134363
428/1.1
2002/0021396 A1 * 2/2002 Yoo ................... G02F 1/133707
349/141
(Continued)

FOREIGN PATENT DOCUMENTS

CN    101017303    8/2007
CN    201654404    11/2010
(Continued)

*Primary Examiner* — Chineyere D Wills-Burns

(57) ABSTRACT

A pixel structure and a liquid crystal display panel are provided. The pixel structure includes a first common electrode, a second common electrode set, a plurality of pixel units formed by a plurality of scanning lines crossing a plurality of data lines. Each of the pixel units corresponding to one of the scanning lines and one of the data lines. Each of the pixel units includes a main electrode, a secondary electrode, and a thin-film transistor. The main electrode corresponds to the first common electrode. The secondary electrode corresponds to the second common electrode set.

12 Claims, 3 Drawing Sheets

(51) Int. Cl.
*G02F 1/1362* (2006.01)
*H01L 27/32* (2006.01)
*H01L 33/38* (2010.01)
*H01L 27/12* (2006.01)

(56) References Cited

U.S. PATENT DOCUMENTS

| | | | | |
|---|---|---|---|---|
| 2002/0089631 | A1* | 7/2002 | Lee | G02F 1/134363 349/141 |
| 2007/0177078 | A1* | 8/2007 | Liu | G02F 1/133555 349/114 |
| 2007/0242009 | A1 | 10/2007 | Su | |
| 2009/0104724 | A1* | 4/2009 | Song | G02F 1/134363 438/30 |
| 2011/0018790 | A1* | 1/2011 | Lee | G02F 1/136286 345/87 |
| 2015/0286102 | A1* | 10/2015 | Lo | G02F 1/1368 349/38 |
| 2017/0097546 | A1* | 4/2017 | Lazo Martinez | G02F 1/133514 |

FOREIGN PATENT DOCUMENTS

| | | |
|---|---|---|
| CN | 103678389 | 3/2014 |
| JP | 02-216121 | 8/1990 |
| JP | 2009-223167 | 10/2009 |

\* cited by examiner

PIXEL STRUCTURE AND LIQUID CRYSTAL DISPLAY PANEL

RELATED APPLICATIONS

This application is a National Phase of PCT Patent Application No. PCT/CN2016/109864 having International filing date of Dec. 14, 2016, which claims the benefit of priority of Chinese Patent Application No. 201610908770.5 filed on Oct. 18, 2016. The contents of the above applications are all incorporated by reference as if fully set forth herein in their entirety.

FIELD AND BACKGROUND OF THE INVENTION

The present disclosure relates to the field of a liquid crystal display (LCD) panel, and more particularly, to a pixel structure and an LCD panel.

A conventional vertical alignment (VA) LCD panel features a wide viewing angle, a high contrast ratio so the VA LCD panel has become a mainstream product. However, the VA LCD panel has a shortcoming of color shift. Please refer to FIG. 1 illustrating a schematic diagram of an equivalent circuit of a pixel unit of an LCD panel adopting the charge-sharing technique. The pixel electrode on each of the pixel units is divided into a main electrode and a secondary electrode. The main electrode is driven by a thin-film transistor (TFT) T1, and the secondary electrode is driven by a TFT T2, a TFT T3, and a sharing capacitor C. Specifically, the LCD panel is driven by scanning row by row. When an nth row is scanned, a scanning signal on a scanning line Gate n is at high voltage level, a scanning signal on a scanning line Gate n+1 is at low voltage level, the TFTs T1 and T2 are conducted, and the TFT T3 is terminated. When the data signal on the data line Data n starts to work, a liquid crystal capacitor CLc_1 and a storage capacitor Cst_1 formed by the main electrode and the common electrode com and a liquid crystal capacitor CLc_2 and a storage capacitor Cst_2 formed by the secondary electrode and the common electrode com starts to be charged to reach a data signal voltage. As a result, both of the main electrode and the secondary electrode reach a data signal voltage. When an (n+1)th row is scanned, a scanning signal on a scanning line Gate n is at low voltage level, a scanning signal on a scanning line Gate n+1 is at high voltage level, the TFTs T1 and T2 are terminated, the TFT T3 is conducted, and the voltage imposed on the secondary electrode starts to change through a charge capacitor C. Thus, the voltage differences are shown between the secondary electrode and the main electrode. Owing to the voltage differences, the low color shift is achieved.

However, the conventional methods of dealing with color shift is that each of the pixel units includes three TFTs and a sharing capacitor, which implies that the structure of each of the pixel units is more complicated and has a lower aperture rate.

Therefore, it is urgent to propose a pixel structure and a liquid crystal display (LCD) panel to solve the conventional technical problem.

SUMMARY OF THE INVENTION

An object of the present disclosure is to propose a pixel structure to solve the technical problems that the conventional pixel structure is more complicated and low aperture rate of the pixel structure because each of the pixel units includes three thin-film transistors (TFT) and a sharing capacitor.

According to the present disclosure, a pixel structure comprises:

a common electrode, comprising a first common electrode and a second common electrode set;

a plurality of pixel units formed by a plurality of scanning lines crossing a plurality of data lines; each of the plurality of pixel units corresponding to one of the plurality of scanning lines and one of the plurality of data lines; each of the plurality of pixel units comprising a main electrode, a secondary electrode, and a thin-film transistor (TFT).

A gate of the TFT is connected to a scanning line corresponding to the pixel unit; a source of the TFT is connected to a data line corresponding to the pixel unit; a drain of the TFT is connected to the main electrode and the secondary electrode;

The main electrode corresponds to the first common electrode; the secondary electrode corresponds to the second common electrode set; different voltages are imposed on the first common electrode and the second common electrode set so that liquid crystal in a pixel zone which the main electrode corresponds to and liquid crystal in a pixel zone which the secondary electrode corresponds to can demonstrate different angles of deflection.

The neighboring pixel units are driven through dot inversion.

Optionally, the second common electrode set comprises a first branch electrode and a second branch electrode; the secondary electrode corresponds to the first branch electrode during the period of positive polarity driving period; the secondary electrode corresponds to the second branch electrode during the period of negative polarity driving period.

Optionally, the voltage imposed on the first common electrode is constant.

Optionally, a voltage imposed on the first branch electrode and a voltage imposed on the second branch electrode are periodically inversed voltages.

Optionally, the polarity of the voltage imposed on the first branch electrode is opposite to the polarity of the voltage imposed on the second branch electrode.

According to the present disclosure, a pixel structure comprises: a common electrode, comprising a first common electrode and a second common electrode set;

a plurality of pixel units formed by a plurality of scanning lines crossing a plurality of data lines; each of the plurality of pixel units corresponding to one of the plurality of scanning lines and one of the plurality of data lines; each of the plurality of pixel units comprising a main electrode, a secondary electrode, and a thin-film transistor (TFT), wherein a gate of the TFT is connected to a scanning line corresponding to the pixel unit; a source of the TFT is connected to a data line corresponding to the pixel unit; a drain of the TFT is connected to the main electrode and the secondary electrode;

the main electrode corresponds to the first common electrode; the secondary electrode corresponds to the second common electrode set; different voltages are imposed on the first common electrode and the second common electrode set so that liquid crystal in a pixel zone which the main electrode corresponds to and liquid crystal in a pixel zone which the secondary electrode corresponds to can demonstrate different angles of deflection.

Optionally, the second common electrode set comprises a first branch electrode and a second branch electrode; the secondary electrode corresponds to the first branch electrode during a positive polarity driving period; the secondary electrode corresponds to the second branch electrode during a negative polarity driving period.

Optionally, the voltage imposed on the first common electrode is constant.

Optionally, a voltage imposed on the first branch electrode and a voltage imposed on the second branch electrode are periodically inversed voltages.

Optionally, the polarity of the voltage imposed on the first branch electrode is opposite to the polarity of the voltage imposed on the second branch electrode.

According to the present disclosure, a liquid crystal display panel comprises a pixel structure. The pixel structure comprises:

a common electrode, comprising a first common electrode and a second common electrode set;

a plurality of pixel units formed by a plurality of scanning lines crossing a plurality of data lines; each of the plurality of pixel units corresponding to one of the plurality of scanning lines and one of the plurality of data lines; each of the plurality of pixel units comprising a main electrode, a secondary electrode, and a thin-film transistor (TFT), wherein a gate of the TFT is connected to a scanning line corresponding to the pixel unit; a source of the TFT is connected to a data line corresponding to the pixel unit; a drain of the TFT is connected to the main electrode and the secondary electrode;

the main electrode corresponds to the first common electrode; the secondary electrode corresponds to the second common electrode set; different voltages are imposed on the first common electrode and the second common electrode set so that liquid crystal in a pixel zone which the main electrode corresponds to and liquid crystal in a pixel zone which the secondary electrode corresponds to can demonstrate different angles of deflection.

Optionally, the second common electrode set comprises a first branch electrode and a second branch electrode; the secondary electrode corresponds to the first branch electrode during the period of positive polarity driving period; the secondary electrode corresponds to the second branch electrode during the period of negative polarity driving period.

Optionally, the voltage imposed on the first common electrode is constant.

Optionally, a voltage imposed on the first branch electrode and a voltage imposed on the second branch electrode are periodically inversed voltages.

Optionally, the polarity of the voltage imposed on the first branch electrode is opposite to the polarity of the voltage imposed on the second branch electrode.

The pixel electrode on each of the pixel units is divided into a main electrode and a secondary electrode. The main electrode corresponds to the first common electrode, and the secondary electrode corresponds to a second common electrode set. The liquid crystal in a pixel zone which the main electrode corresponds to and the liquid crystal in a pixel zone which the secondary electrode corresponds to can demonstrate different angles of deflection. Also, only one TFT is used by each of the pixel units. In this way, the problems, such as color shift, complicated structure, and low aperture rates, are solved and improved. The conventional method of dealing with color shift is that each of the pixel units includes three TFTs and a sharing capacitor. In other words, the structure of each of the pixel units is complicated and has a low aperture rate.

These and other features, aspects and advantages of the present disclosure will become understood with reference to the following description, appended claims and accompanying figures.

BRIEF DESCRIPTION OF THE SEVERAL VIEWS OF THE DRAWINGS

For better understanding embodiments of the present invention, the following detailed description taken in conjunction with the accompanying drawings is provided. Apparently, the accompanying drawings are merely for some of the embodiments of the present invention. Any ordinarily skilled person in the technical field of the present invention could still obtain other accompanying drawings without use laborious invention based on the present accompanying drawings.

DESCRIPTION OF SPECIFIC EMBODIMENTS OF THE INVENTION

The accompanying drawings are included to provide a further understanding of the invention, and are incorporated in and constitute a part of this specification. The drawings illustrate embodiments of the invention and, together with the description, serve to explain the principles of the invention.

According to the present disclosure, a pixel structure comprises a common electrode, a plurality of pixel units formed by a plurality of scanning lines crossing a plurality of data lines. The common electrode comprises a first common electrode and a second common electrode set. The plurality of pixel units are formed by a plurality of scanning lines crossing a plurality of data lines. Each of the plurality of pixel units corresponds to one of the plurality of scanning lines and one of the plurality of data lines. Each of the plurality of pixel units comprises a main electrode, a secondary electrode, and a thin-film transistor (TFT). A gate of the TFT is connected to a scanning line corresponding to the pixel unit. A source of the TFT is connected to a data line corresponding to the pixel unit. A drain of the TFT is connected to the main electrode and the secondary electrode. The main electrode corresponds to the first common electrode. The secondary electrode corresponds to the second common electrode set. Different voltages are imposed on the first common electrode and the second common electrode set so that liquid crystal in a pixel zone which the main electrode corresponds to and liquid crystal in a pixel zone which the secondary electrode corresponds to can demonstrate different angles of deflection.

Figure 1:
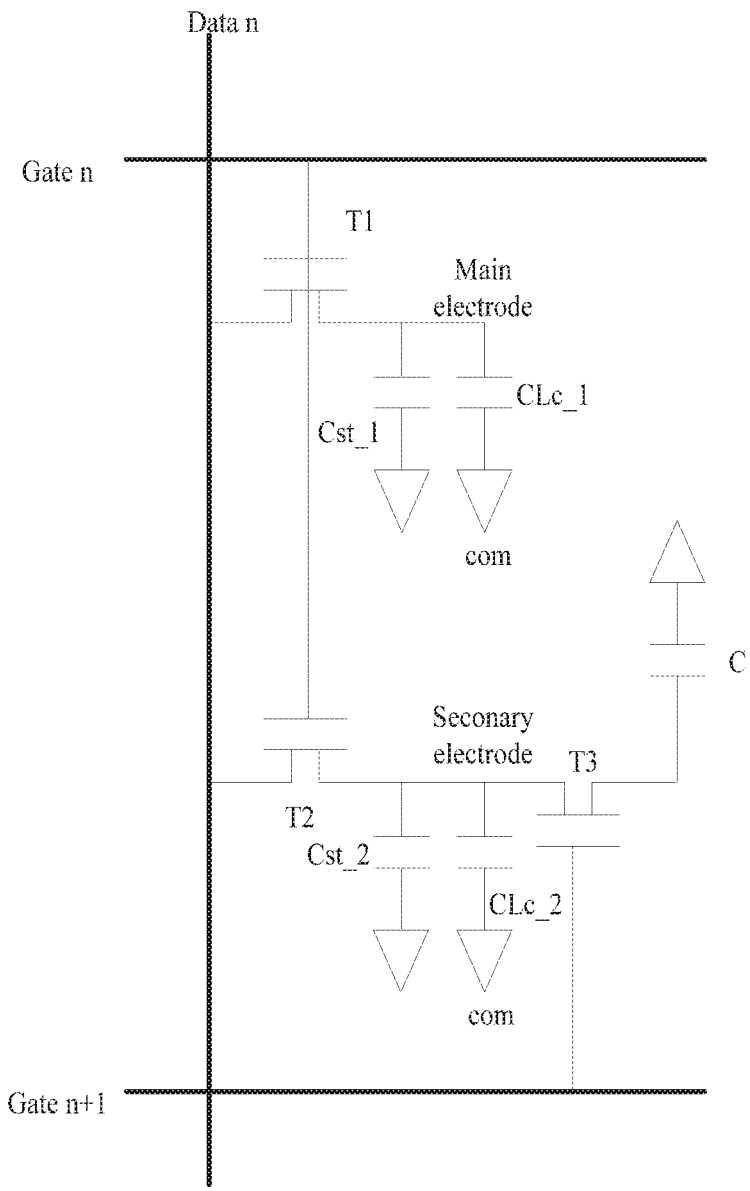
FIG. 1 illustrates a schematic diagram of an equivalent circuit of a pixel unit of an LCD panel adopting the charge-sharing technique.
Figure 2:
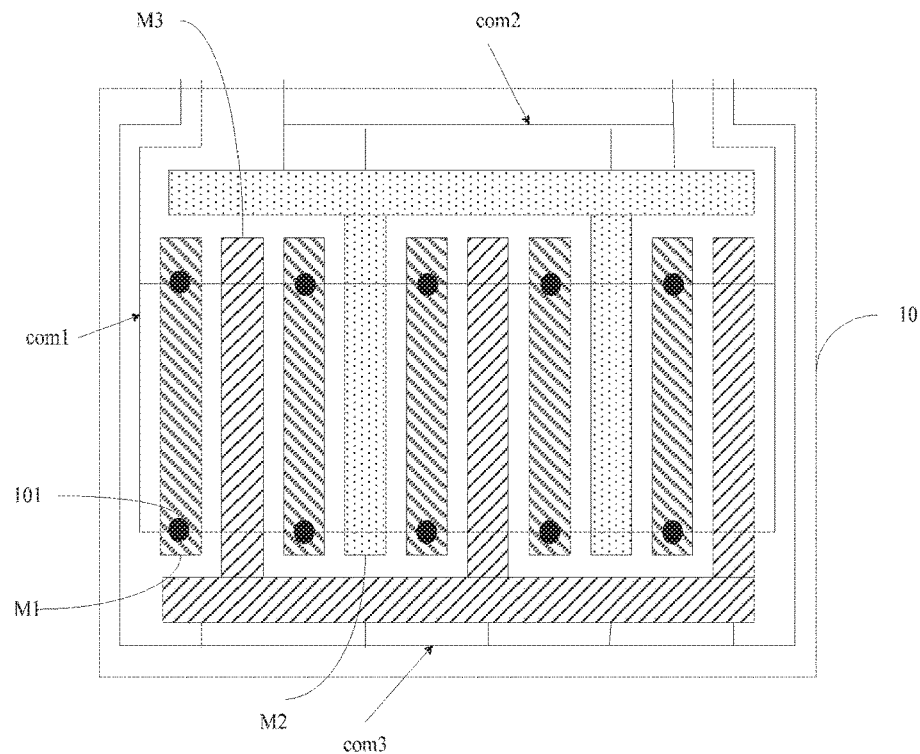
FIG. 2 illustrates a schematic diagram of a common electrode for a pixel structure according to one preferred embodiment of the present disclosure.

Please refer to FIG. 2 illustrating a schematic diagram of a common electrode for a pixel structure according to one preferred embodiment of the present disclosure.

The common electrode 10 in the pixel structure of the preferred embodiment includes a first common electrode com1 and a second common electrode set. The second common electrode set includes a first branch electrode com2 and a second branch electrode com3. The first common electrode com1 is formed by a plurality of strip first electrodes M1. The first branch electrode com2 is formed by a plurality of bar-shaped second electrodes M2. The second branch electrode com3 is formed by a plurality of bar-shaped third electrodes M3. The second electrode M2 and the third electrode M3 are arranged on two terminals of each of the plurality of first electrodes M1. The plurality of first electrodes M1 are connected through a conductive support 101. The plurality of second electrodes M2 extend upward. A plurality of vertically arranged second electrodes M2 are connected through a horizontally arranged second electrode M2. The plurality of third electrodes M3 extend downward. A plurality of vertically arranged third electrodes M3 are connected through a horizontally arranged third electrode M3.

An object of the present disclosure is to propose a first common electrode com1 and a second common electrode set with which the conventional common electrode set is replaced. The second common electrode set includes the first branch electrode com2 and the second branch electrode com3. The first branch electrode com2 and the second branch electrode com3 correspond to the main electrode and the secondary electrode in each of the plurality of pixel units, respectively so that the liquid crystal in a pixel zone which the main electrode corresponds to and the liquid crystal in a pixel zone which the secondary electrode corresponds to demonstrate different angles of deflection. Other similar structures are within the scope the present disclosure with the premise that the structures are designed based on the description of the present disclosure.

Further, the pixel structure further includes a plurality of pixel units formed by a plurality of data lines crossing a plurality of scanning lines. Each of the plurality of pixel units includes a main electrode and a secondary electrode. The main electrode corresponds to a first common electrode so that the liquid crystal in a pixel zone which the main electrode corresponds to deflect to a certain degree. The secondary electrode corresponds to a second common electrode set so that the liquid crystal in a pixel zone which the secondary electrode corresponds to deflect to a certain degree. Specifically, any neighboring pixel units are driven through positive polarity driving and negative polarity driving, respectively. During positive polarity driving period, the main electrode corresponds to the first common electrode, and the secondary electrode corresponds to the first branch common electrode. In the pixel unit driven by negative polarity driving period, the main electrode corresponds to the first common electrode, and the secondary electrode corresponds to the second branch common electrode. Owing to the design of the secondary electrodes on the neighboring pixel units corresponding to the first and second branch common electrodes respectively, color shift between the neighboring pixel units is controlled.

Figure 3:
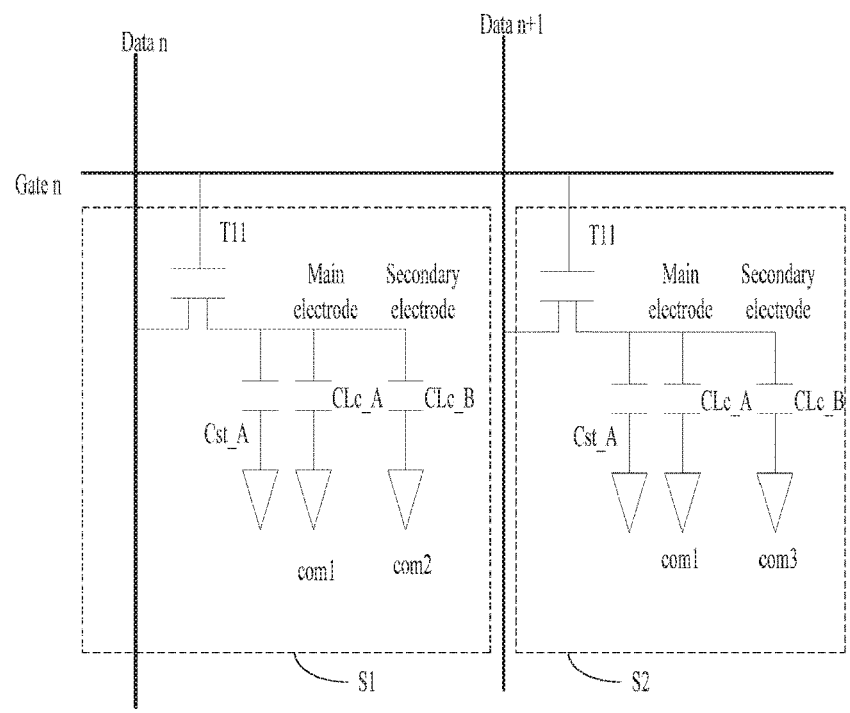
FIG. 3 illustrates an equivalent circuit diagram of the pixel structure according to the preferred embodiment of the present disclosure.

Please refer to FIG. 3 illustrating an equivalent circuit diagram of the pixel structure according to the preferred embodiment of the present disclosure.

Each of the plurality of pixel units corresponds to one scanning line and a data line and includes a main electrode, a secondary electrode, and a TFT. A gate of the TFT is connected to a scanning line corresponding to the pixel unit; a source of the TFT is connected to a data line corresponding to the pixel unit; a drain of the TFT is connected to the main electrode and the secondary electrode.

The nth scanning line Gate n and the nth data line Data n cross and form a pixel unit S1. The pixel unit S1 includes a main electrode, a secondary electrode, and a TFT T11. A gate of the TFT T11 is connected to the nth scanning line Gate n. A source of the TFT T11 is connected to the nth scanning line Gate n. A drain of the TFT T11 is connected to the main electrode and the secondary electrode. The main electrode, the secondary electrode, and the nth scanning line Gate n form a storage capacitor Cst_A. The main electrode and the first common electrode com1 form a main liquid crystal capacitor CLc_A. The secondary electrode and the first common electrode com1 form a secondary liquid crystal capacitor CLc_B.

The nth scanning line Gate n and the (n+1)th data line Data n+1 cross and form a pixel unit S2. The pixel unit S2 includes a main electrode, a secondary electrode, and a TFT T11. A gate of the TFT T11 is connected to the nth scanning line Gate n. A source of the TFT T11 is connected to the (n+1)th scanning line Gate n+1. A drain of the TFT T11 is connected to the main electrode and the secondary electrode. The main electrode, the secondary electrode, and the nth scanning line Gate n form a storage capacitor Cst_A. The main electrode and the first common electrode com1 form a main liquid crystal capacitor CLc_A. The secondary electrode and the second branch electrode com3 form a secondary liquid crystal capacitor Cst_B.

Figure 4:
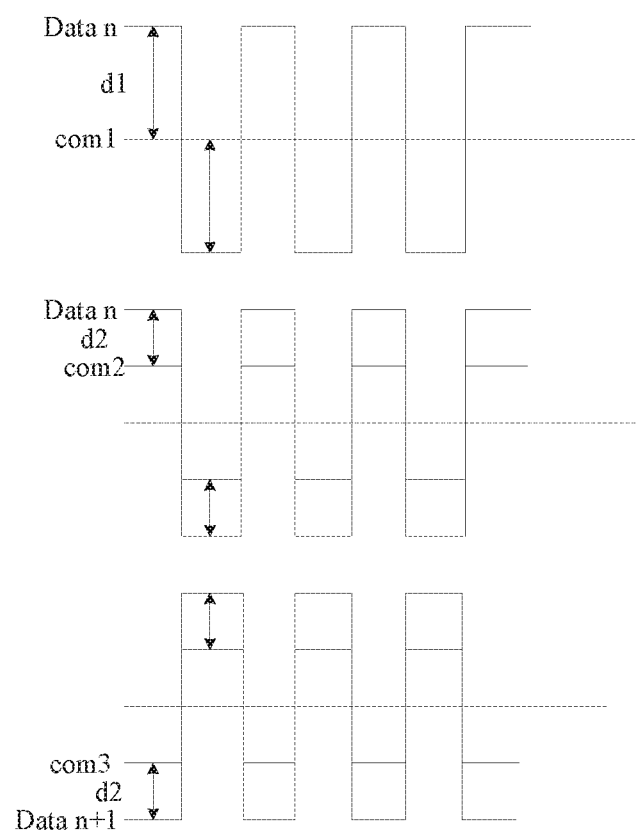
FIG. 4 illustrates waveforms of signals of a driven pixel structure according to the preferred embodiment of the present disclosure.

Please refer to FIG. 4 illustrating waveforms of signals of a driven pixel structure according to the preferred embodiment of the present disclosure.

As FIG. 3 and FIG. 4 show, when the pixel unit S1 is driven on the LCD panel in operation, the scan signal on the nth scanning line Gate n is at high voltage level, and the TFT T11 is turn on. The driving voltage imposed on the nth data line Data n is transmitted to the main electrode and the secondary electrode through the TFT T11. At this time, a constant voltage is imposed on the first common electrode com1 which corresponds to the main electrode so that a first voltage difference d1 can be formed between the main electrode and the first common electrode com1. Also, a periodically inversed voltage is imposed on the first branch electrode com2 which corresponds to the secondary electrode so that a second voltage difference d2 can be formed between the secondary electrode and the first branch electrode com2. Specifically, the differences can be manipulated between the first voltage difference d1 and the second voltage difference d2 so that the liquid crystal in the pixel zone which the main electrode corresponds to and the liquid crystal in the pixel zone which the secondary electrode corresponds to can demonstrate different angles of deflection to a certain degree. Further, color shift is improved.

When the pixel unit S2 is driven, the scan signal on the nth scanning line Gate n is at high voltage level, and the TFT T11 is turn on. The driving voltage imposed on the (n+1)th data line Data n+1 is transmitted to the main electrode and the secondary electrode through the TFT T11. At this time, a constant voltage is imposed on the first common electrode com1 which corresponds to the main electrode so that a first voltage difference d1 can be formed between the main electrode and the first common electrode com1. Also, a periodically inversed voltage is imposed on the second branch electrode com3 which corresponds to the secondary electrode. The polarity of the periodically inversed voltage imposed on the second branch electrode com3 is opposite to the polarity of the periodically inversed voltage imposed on the first branch electrode com2 so that the second voltage difference d2 can be formed between the secondary electrode and the second branch electrode com3. Likewise, the differences can be manipulated between the first voltage difference d1 and the second voltage difference d2 so that the liquid crystal in the pixel zone which the main electrode corresponds to and the liquid crystal in the pixel zone which the secondary electrode corresponds to can demonstrate different angles of deflection to a certain degree. Further, color shift is improved.

A voltage imposed on the Nth data line Data n and a voltage imposed on the (n+1)th data line Data n+1 are opposite in polarities. Therefore, the polarity of a voltage imposed on the first branch electrode com2 is opposite to the polarity of a voltage imposed on the second branch electrode com3.

Further, a liquid crystal display (LCD) panel is proposed by the present disclosure. The LCD panel includes the pixel structure introduced in the preferred embodiment. The pixel structure has been detailed and can be referred to.

The pixel electrode on each of the pixel units is divided into a main electrode and a secondary electrode. The main electrode corresponds to the first common electrode, and the secondary electrode corresponds to a second common electrode set. The liquid crystal in a pixel zone which the main electrode corresponds to and the liquid crystal in a pixel zone which the secondary electrode corresponds to can demonstrate different angles of deflection. Also, only one TFT is used by each of the pixel units. In this way, the problems, such as color shift, complicated structure, and low aperture rates, are solved and improved. The conventional method of dealing with color shift is that each of the pixel units includes three TFTs and a sharing capacitor. In other words, the structure of each of the pixel units is complicated and has a low aperture rate.

The present disclosure proposes a pixel electrode and a liquid crystal display panel. The pixel electrode on each of the pixel units is divided into a main electrode and a secondary electrode. The main electrode corresponds to the first common electrode, and the secondary electrode corresponds to a second common electrode set. The liquid crystal in a pixel zone which the main electrode corresponds to and the liquid crystal in a pixel zone which the secondary electrode corresponds to can demonstrate different angles of deflection. Also, only one TFT is used by each of the pixel units. In this way, the problems, such as color shift, complicated structure, and low aperture rates, are solved and improved. The conventional method of dealing with color shift is that each of the pixel units includes three TFTs and a sharing capacitor. In other words, the structure of each of the pixel units is complicated and has a low aperture rate.

The present disclosure is described in detail in accordance with the above contents with the specific preferred examples. However, this present disclosure is not limited to the specific examples. For the ordinary technical personnel of the technical field of the present disclosure, on the premise of keeping the conception of the present disclosure, the technical personnel can also make simple deductions or replacements, and all of which should be considered to belong to the protection scope of the present disclosure.

What is claimed is:

1. A pixel structure, comprising: a common electrode, comprising a plurality of first common electrodes and a second common electrode set; a plurality of pixel units formed by a plurality of scanning lines crossing a plurality of data lines; each of the plurality of pixel units corresponding to one of the plurality of scanning lines and one of the plurality of data lines; each of the plurality of pixel units comprising a main electrode, a secondary electrode, and a thin-film transistor (TFT), wherein a gate of the TFT is connected to a scanning line corresponding to the pixel unit; a source of the TFT is connected to a data line corresponding to the pixel unit; a drain of the TFT is connected to the main electrode and the secondary electrode; the main electrode corresponds to the first common electrode; the secondary electrode corresponds to the second common electrode set; different voltages are imposed on the first common electrode and the second common electrode set so that liquid crystal in a pixel zone which the main electrode corresponds to and liquid crystal in a pixel zone which the secondary electrode corresponds to can demonstrate different angles of deflection; the neighboring pixel units are driven through dot inversion, wherein the second common electrode set comprises a first branch electrode and a second branch electrode; the secondary electrode corresponds to the first branch electrode during a positive polarity driving period; the secondary electrode corresponds to the second branch electrode during a negative polarity driving period, wherein the first branch electrode comprises a plurality of bar-shaped second electrodes and a strip second electrode perpendicular to and connected to the bar-shaped second electrodes, and the second branch electrode comprises a plurality of bar-shaped third electrodes and a strip third electrode perpendicular to and connected to the bar-shaped third electrodes, wherein a strip first electrode is located between each one of the bar-shaped second electrodes and bar-shaped third electrodes and a plurality of the strip first electrodes are connected through a conductive support.

2. The pixel structure of claim 1, wherein the voltage imposed on the first common electrode is constant.

3. The pixel structure of claim 1, wherein a voltage imposed on the first branch electrode and a voltage imposed on the second branch electrode are periodically inversed voltages.

4. The pixel structure of claim 3, wherein the polarity of the voltage imposed on the first branch electrode is opposite to the polarity of the voltage imposed on the second branch electrode.

5. A pixel structure, comprising: a common electrode, comprising a plurality of first common electrodes and a second common electrode set; a plurality of pixel units formed by a plurality of scanning lines crossing a plurality of data lines; each of the plurality of pixel units corresponding to one of the plurality of scanning lines and one of the plurality of data lines; each of the plurality of pixel units comprising a main electrode, a secondary electrode, and a thin-film transistor (TFT), wherein a gate of the TFT is connected to a scanning line corresponding to the pixel unit; a source of the TFT is connected to a data line corresponding to the pixel unit; a drain of the TFT is connected to the main electrode and the secondary electrode; the main electrode corresponds to the first common electrode; the secondary electrode corresponds to the second common electrode set; different voltages are imposed on the first common electrode and the second common electrode set so that liquid crystal in a pixel zone which the main electrode corresponds to and liquid crystal in a pixel zone which the secondary electrode corresponds to can demonstrate different angles of deflection, wherein the second common electrode set comprises a first branch electrode and a second branch electrode; the secondary electrode corresponds to the first branch electrode during a positive polarity driving period; the secondary electrode corresponds to the second branch electrode during a negative polarity driving period, wherein the first branch electrode comprises a plurality of bar-shaped second electrodes and a strip second electrode perpendicular to and connected to the bar-shaped second electrodes, and the second branch electrode comprises a plurality of bar-shaped third electrodes and a strip third electrode perpendicular to and connected to the bar-shaped third electrodes, wherein a strip first electrode is located between each one of the bar-shaped second electrodes and bar-shaped third electrodes and a plurality of the strip first electrodes are connected through a conductive support.

6. The pixel structure of claim 5, wherein the voltage imposed on the first common electrode is constant.

7. The pixel structure of claim 5, wherein a voltage imposed on the first branch electrode and a voltage imposed on the second branch electrode are periodically inversed voltages.

8. The pixel structure of claim 7, wherein the polarity of the voltage imposed on the first branch electrode is opposite to the polarity of the voltage imposed on the second branch electrode.

9. A liquid crystal display panel, comprising a pixel structure, the pixel structure comprising: a common electrode, comprising a plurality of first common electrodes and a second common electrode set; a plurality of pixel units formed by a plurality of scanning lines crossing a plurality of data lines; each of the plurality of pixel units corresponding to one of the plurality of scanning lines and one of the plurality of data lines; each of the plurality of pixel units comprising a main electrode, a secondary electrode, and a thin-film transistor (TFT), wherein a gate of the TFT is connected to a scanning line corresponding to the pixel unit; a source of the TFT is connected to a data line corresponding to the pixel unit; a drain of the TFT is connected to the main electrode and the secondary electrode; the main electrode corresponds to the first common electrode; the secondary electrode corresponds to the second common electrode set; different voltages are imposed on the first common electrode and the second common electrode set so that liquid crystal in a pixel zone which the main electrode corresponds to and liquid crystal in a pixel zone which the secondary electrode corresponds to can demonstrate different angles of deflection, wherein the second common electrode set comprises a first branch electrode and a second branch electrode; the secondary electrode corresponds to the first branch electrode during a positive polarity driving period; the secondary electrode corresponds to the second branch electrode during a negative polarity driving period, wherein the first branch electrode comprises a plurality of bar-shaped second electrodes and a strip second electrode perpendicular to and connected to the bar-shaped second electrodes, and the second branch electrode comprises a plurality of bar-shaped third electrodes and a strip third electrode perpendicular to and connected to the bar-shaped third electrodes, wherein a strip first electrode is located between each one of the bar-shaped second electrodes and bar-shaped third electrodes and a plurality of the strip first electrodes are connected through a conductive support.

10. The liquid crystal display panel of claim 9, wherein the voltage imposed on the first common electrode is constant.

11. The liquid crystal display panel of claim 9, wherein a voltage imposed on the first branch electrode and a voltage imposed on the second branch electrode are periodically inversed voltages.

12. The liquid crystal display panel of claim 11, wherein the polarity of the voltage imposed on the first branch electrode is opposite to the polarity of the voltage imposed on the second branch electrode.

* * * * *